(12) United States Patent
Koide et al.

(10) Patent No.: US 9,651,986 B2
(45) Date of Patent: May 16, 2017

(54) ELECTRONIC APPARATUS

(71) Applicant: Kabushiki Kaisha Toshiba, Tokyo (JP)

(72) Inventors: Shingo Koide, Tachikawa (JP); Daisuke Maehara, Ome (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 78 days.

(21) Appl. No.: 14/332,541

(22) Filed: Jul. 16, 2014

(65) Prior Publication Data

US 2015/0103502 A1    Apr. 16, 2015

Related U.S. Application Data

(60) Provisional application No. 61/889,454, filed on Oct. 10, 2013.

(51) Int. Cl.
*G06F 1/16* (2006.01)
*H05K 1/02* (2006.01)

(52) U.S. Cl.
CPC .......... *G06F 1/1616* (2013.01); *G06F 1/1675* (2013.01); *G06F 1/1683* (2013.01); *H05K 1/0269* (2013.01)

(58) Field of Classification Search
CPC .............................. H05K 1/0266; H05K 1/0269
USPC ................................. 361/760, 772; 349/150
See application file for complete search history.

(56) References Cited

U.S. PATENT DOCUMENTS

| | | | | |
|---|---|---|---|---|
| 5,219,292 A * | 6/1993 | Dickirson | ............ | H01R 9/096 439/65 |
| 7,232,315 B2 * | 6/2007 | Uchida | ............... | H01R 12/721 439/492 |
| 7,713,092 B2 * | 5/2010 | Kim | .................. | G02F 1/133603 439/284 |
| 7,944,707 B2 * | 5/2011 | Hung | ..................... | H01L 23/13 174/260 |
| 7,965,366 B2 * | 6/2011 | Shie | ....................... | H05K 3/361 349/149 |
| 2001/0034156 A1 * | 10/2001 | Yamane | ............... | H01R 13/641 439/492 |
| 2012/0075817 A1 * | 3/2012 | Yeates | .................... | H05K 1/117 361/760 |
| 2012/0156948 A1 * | 6/2012 | Kawabata | ............. | H05K 3/361 439/876 |
| 2013/0319739 A1 * | 12/2013 | Arnold | ................. | H01R 12/714 174/258 |

FOREIGN PATENT DOCUMENTS

| | | |
|---|---|---|
| JP | 6-44129 | 11/1994 |
| JP | 2000-223803 | 8/2000 |
| JP | 2001-148554 | 5/2001 |

* cited by examiner

*Primary Examiner* — Adrian S Wilson
(74) *Attorney, Agent, or Firm* — Rutan & Tucker, LLP

(57) ABSTRACT

According to one embodiment, an electronic apparatus includes a housing, a circuit board in the housing, and a connector. The connector includes an opening into which a flexible cable is configured to be plugged. The connector is attached to the circuit board and faces an inner surface of the housing. The circuit board includes a cutout in a position corresponding to a center portion of the opening of the connector.

10 Claims, 11 Drawing Sheets

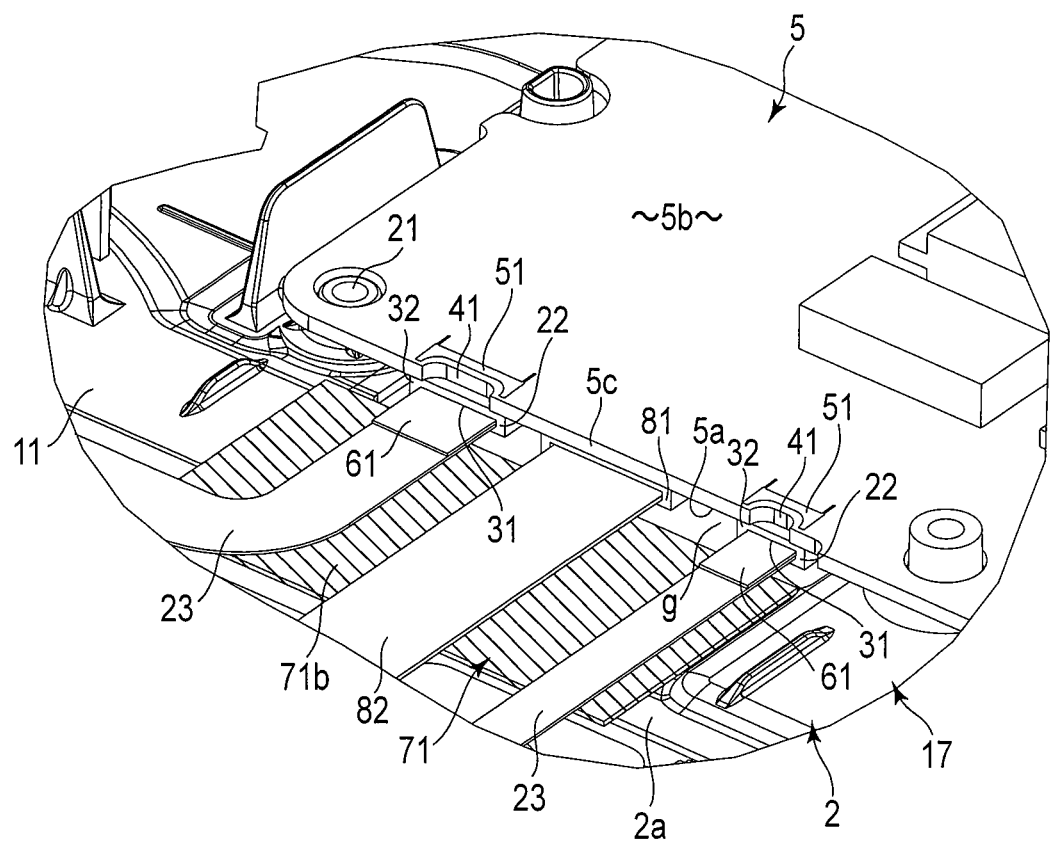
F I G. 2

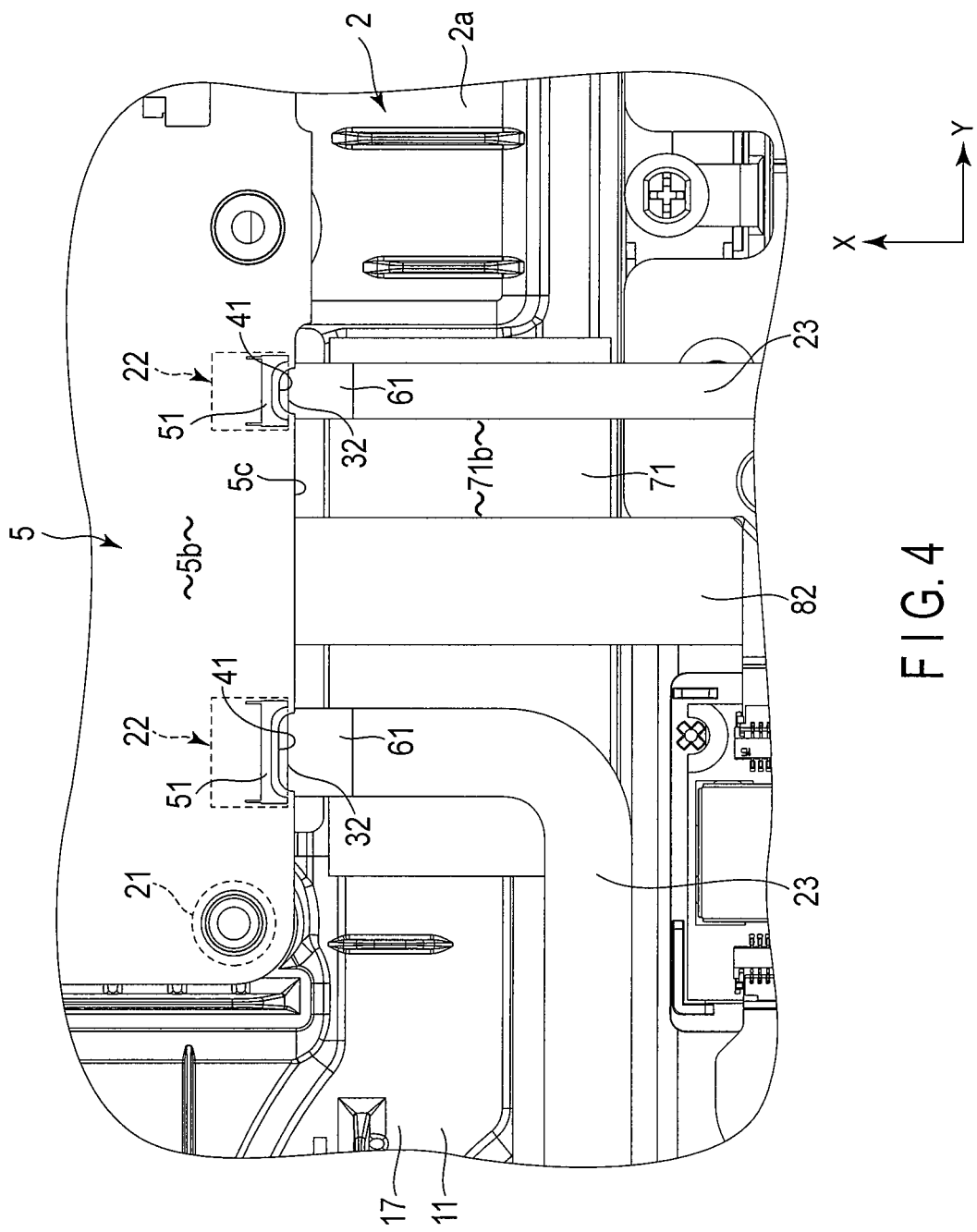
F I G. 4

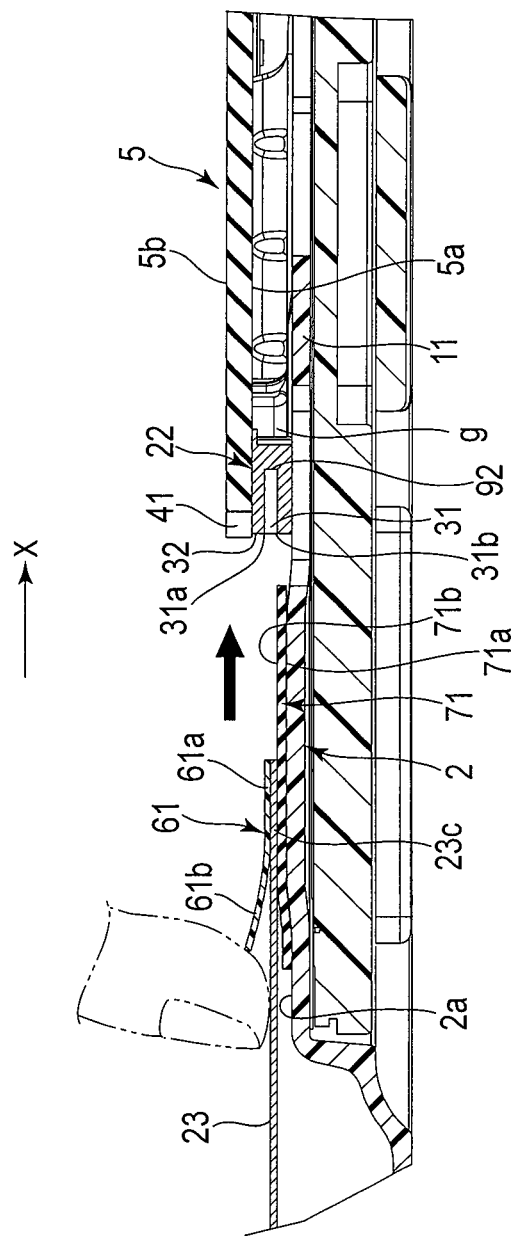
F I G. 7

ELECTRONIC APPARATUS

CROSS-REFERENCE TO RELATED APPLICATIONS

This application claims the benefit of U.S. Provisional Application No. 61/889,454, filed Oct. 10, 2013, the entire contents of which are incorporated herein by reference.

FIELD

Embodiments described herein relate generally to an electronic apparatus.

BACKGROUND

There is provided an electronic apparatus comprising a circuit board and a connector attached thereto.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is an exemplary perspective view illustrating a circuit board and connectors of the electronic apparatus shown in FIG. 1.

FIG. 4 is an exemplary plan view illustrating the circuit board and the connectors shown in FIG. 2.

FIG. 7 is an exemplary sectional view illustrating the connector and the flexible cable shown in FIG. 2.

DETAILED DESCRIPTION

Various embodiments will be described hereinafter with reference to the accompanying drawings.

In general, according to one embodiment, an electronic apparatus comprises a housing, a circuit board in the housing, and a connector. The connector comprises an opening into which a flexible cable is configured to be plugged. The connector is attached to the circuit board, and faces an inner surface of the housing. The circuit board comprises a cutout in a position corresponding to a center portion of the opening of the connector.

Some components are expressed by two or more terms. Those terms are just examples. Those components may be further expressed by another or other terms. And the other components which are not expressed by two or more terms may be expressed by another or other terms.

First Embodiment

FIGS. 1 to 8 illustrate an electronic apparatus 1 according to a first embodiment. The electronic apparatus 1 is, for example, a notebook portable computer (i.e., notebook PC). It should be noted that an electronic apparatus to which the first embodiment is applicable is not limited to this example. The first embodiment is widely applicable to various types of electronic apparatuses such as a television receiver, a tablet (i.e., slate) portable computer, a cellphone (including smartphone) and a game machine.

Figure 1:
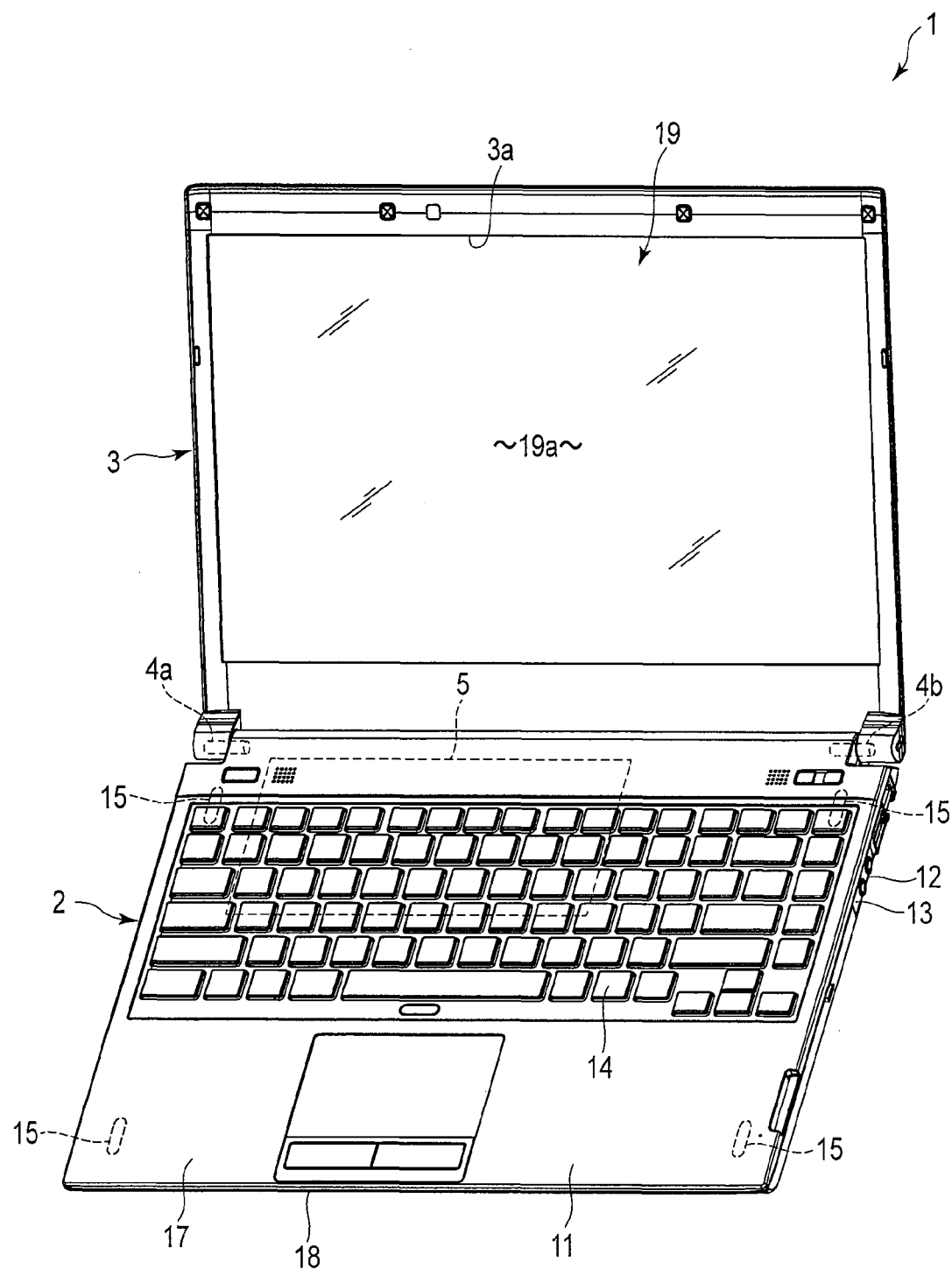
FIG. 1 is an exemplary perspective view illustrating an electronic apparatus according to a first embodiment.

As shown in FIG. 1, the electronic apparatus 1 has a first housing 2, a second housing 3, and a pair of hinges 4a and 4b. The first housing 2 is, for example, a main housing. The first housing 2 accommodates a circuit board 5, for example, as a main board.

The first housing 2 has an upper wall 11, a lower wall 12 (i.e., bottom wall) and a peripheral wall 13, and formed into a flat box shape. The upper wall 11 is an example of a first wall while the lower wall 12 is an example of a second wall. It should be noted in this description that upper, lower, left and right are defined from the point view of a user.

The upper wall 11 extends in a longitudinal direction (e.g., substantially horizontal direction) of the first housing 2. The upper wall 11 is provided with a keyboard 14 as an example of an input portion. It should be noted that the input portion provided on the upper wall 11 may be, for example, a touchpanel (i.e., touchsensor) or other input devices, not limited to a keyboard.

The lower wall 12 is located opposite to the upper wall 11, extending, for example, substantially parallel to the upper wall 11. When the electronic apparatus 1 is placed on a desk, the lower wall 12 faces the desk surface (i.e., external placement surface). The lower wall 12 has, for example, a plurality of legs 15 (i.e., supporting portions). When the electronic apparatus 1 is placed on a desk, the legs 15 contact the desk surface to support the electronic apparatus 1.

The peripheral wall 13 extends in a direction crossing the upper wall 11 and the lower wall 12, and connects the peripheral portion of the lower wall 12 with that of the upper wall 11. The peripheral wall 13 extends in a thickness direction of the first housing 2.

Also, the first housing 2 comprises an upper cover 17 (i.e., cover or first cover) and a lower cover 18 (i.e., base or second cover). The upper cover 17 comprises, for example, the upper wall 11 and a part of the peripheral wall 13. The lower cover 18 comprises, for example, the lower wall 12 and a part of the peripheral wall 13. The first housing 2 is formed by combining the upper cover 17 and the lower cover 18.

On the other hand, the second housing 3 is a display housing, for example. The second housing 3 accommodates a display apparatus 19 (i.e., display module or unit). An example of the display apparatus 19 is a liquid crystal display device, not limited thereto. The display apparatus 19 has a display screen 19a, on which an image displayed. The second housing 3 is provided with an opening 3a, which exposes the display screen 19a to the outside.

The hinges 4a and 4b are rotatably attached (i.e., openable and closable) to the first housing 2 and the second housing 3. This makes the electronic apparatus 1 openable and closable (i.e., deformable or foldable) between a first state (e.g., closing state), where the second housing 3 is overlapped with the first housing 2 and the electronic apparatus 1 is closed, and a second state (e.g., opening state), where the second housing 3 is stood with respect to the first housing 2 and the electronic apparatus 1 is open.

Next, an internal structure of the first housing 2 (hereinafter, housing 2) will be described in detail.

FIG. 2 shows an inner surface of the upper cover 17, with the upper cover 17 upside down. As shown in FIG. 2, attaching portions 21 (i.e., fixing portions), which face the circuit board 5, are provided on the inner surface of the upper cover 17. The attaching portions 21 support the circuit board 5. The circuit board 5 is attached to the attaching portions 21 by fixing members such as screws and fixed to the upper cover 17.

Therefore, the circuit board 5 is located closer to the upper wall 11 of the housing 2 than to the lower wall 12 of the housing 2, making a gap between the circuit board 5 and the inner surface of the upper wall 11 (i.e., the inner surface of the upper cover 17) small. It should be noted that the circuit board 5 may be fixed to the lower cover 18 in lieu of the upper cover 17.

As shown in FIG. 2, the circuit board 5 comprises a first surface 5a and a second surface 5b. The first surface 5a faces an inner surface 2a of the housing 2 (e.g. the inner surface of the upper cover 17, or the inner surface of the upper wall 11). The second surface 5b is located opposite to the first surface 5a and exposed to the inside of the housing 2. Also, the circuit board 5 comprises a side surface 5c (i.e., third surface). The side surface 5c extends in a thickness direction of the circuit board 5 and connects the first surface 5a and the second surface 5b. It should be noted that the side surface 5c in the first embodiment is a periphery surface of the circuit board 5 in a portion where a cutout 41 (described below) is not provided.

Figure 3:
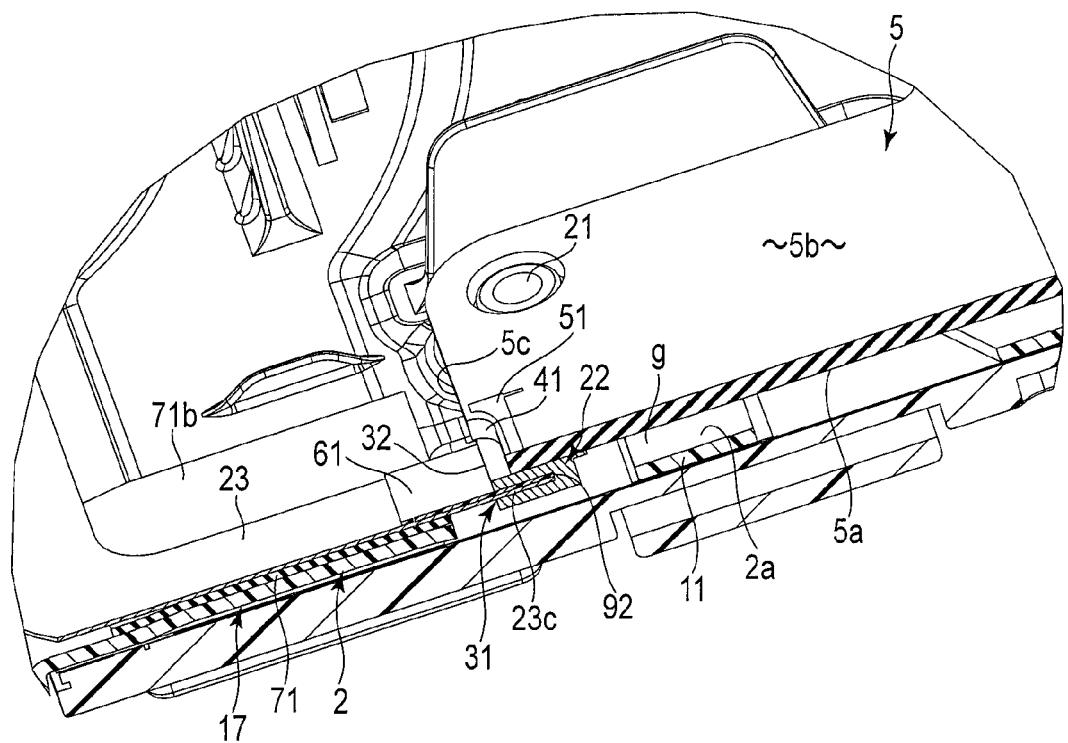
FIG. 3 is an exemplary sectional view illustrating the circuit board and the connector shown in FIG. 2.

As shown in FIGS. 2 and 3, connectors 22 (i.e., first connectors) are attached on the first surface 5a of the circuit board 5. The connector 22 is a Non-ZIF (Zero Insertion Force) connector that does not have a lock, for example. It should be noted that the connector 22 is not limited to this example and may be other various types of connectors.

The connector 22 comprises an opening 31 (i.e., insertion opening), into which a flexible cable 23 is configured to be inserted, and a front surface 32, on which the opening 31 is open.

The front surface 32 is an example of a surface (e.g., outer surface or outline surface) of the connector 22. The flexible cable 23 is inserted into the opening 31, plugged into the internal space of the connector 22, and then connected to the connector 22.

The flexible cable 23 is formed flat, with a plurality of conductor wires (e.g., core wires) lined up horizontally. That is, the flexible cable 23 is formed flat substantially parallel to the inner surface 2a of the housing 2 (or the first surface 5a of the circuit board 5). The flexible cable 23 comprises a surface that faces the inner surface 2a of the housing 2. It should be noted that the surface that faces the inner surface 2a of the housing 2 of the flexible cable 23 is not limited to a flat surface and may have concavity and convexity in line with the outer shapes of the plurality of conductor wires. The opening 31 of the connector 22 is formed flat according to the outer form of the flexible cable 23.

The connector 22 is mounted on the first surface 5a of the circuit board 5 and located between the circuit board 5 and the inner surface 2a of the housing 2 (e.g. the inner surface of the upper cover 17, or the inner surface of the upper wall 11). This makes the connector 22 face the inner surface 2a of the housing 2. The connector 22 is attached to the end portion of the circuit board 5. Therefore, the opening 31 of the connector 22 is exposed to the inside of the housing 2 from a gap g between the circuit board 5 and the inner surface 2a of the housing 2.

As shown in FIGS. 2 to 5, the circuit board 5 is provided with the cutout 41 at the end portion. The cutout 41 is a recess that is recessed from the side surface 5c of the circuit board 5. The cutout 41 connects both of the first surface 5a and the second surface 5b of the circuit board 5 and is recessed from the side surface 5c of the circuit board 5 to the center portion of the circuit board 5.

The cutout 41 is provided in a position corresponding to the center portion of the opening 31 of the connector 22 (i.e., the center portion of the connector). It should be noted that "provided in a position corresponding to the center portion of the opening" means that when the circuit board 5 is planarly viewed, the center portion of the opening 31 of the connector 22 and the cutout 41 are lined in an insertion direction X of the flexible cable 23. The width of the cutout 41 is slightly smaller than, for example, a width W of the opening 31. It should be noted that the width of the cutout 41 may be substantially the same as or larger than the width W of the opening 31.

In the first embodiment, the front surface 32 of the connector 22 is located in a slightly deep position from the side surface 5c of the circuit board 5. A part of the connector 22 is exposed on the side of the second surface 5b of the circuit board 5 through the cutout 41. It should be noted that the front surface 32 of the connector 22 may exist in a position corresponding to the side surface 5c of the circuit board 5. That is, the front surface 32 of the connector 22 and the side surface 5c of the circuit board 5 may exist on substantially the same plane. In other words, the front surface 32 of the connector 22 and the side surface 5c of the circuit board 5 may be lined in a thickness direction of the circuit board 5.

Next, a marking 51, which is provided on the circuit board 5, will be described in detail.

The marking 51 is provided on the second surface 5b of the circuit board 5 and formed in a position corresponding to the connector 22 (e.g., a location on the back side of the connector 22). The marking 51 is provided on the end portion of the circuit board 5 and located near the cutout 41. The marking 51 includes, for example, a form in line with the cutout 41.

The marking 51 includes a portion having substantially the same width as that of the opening 31 of the connector 22, for example. It should be noted that "[t]he marking 51 includes a portion having substantially the same width as that of the opening 31 of the connector 22" means that the distance between any two edge portions (i.e., side portions) constituting the marking 51 are substantially the same as the width of the opening 31 of the connector 22.

Figure 5:
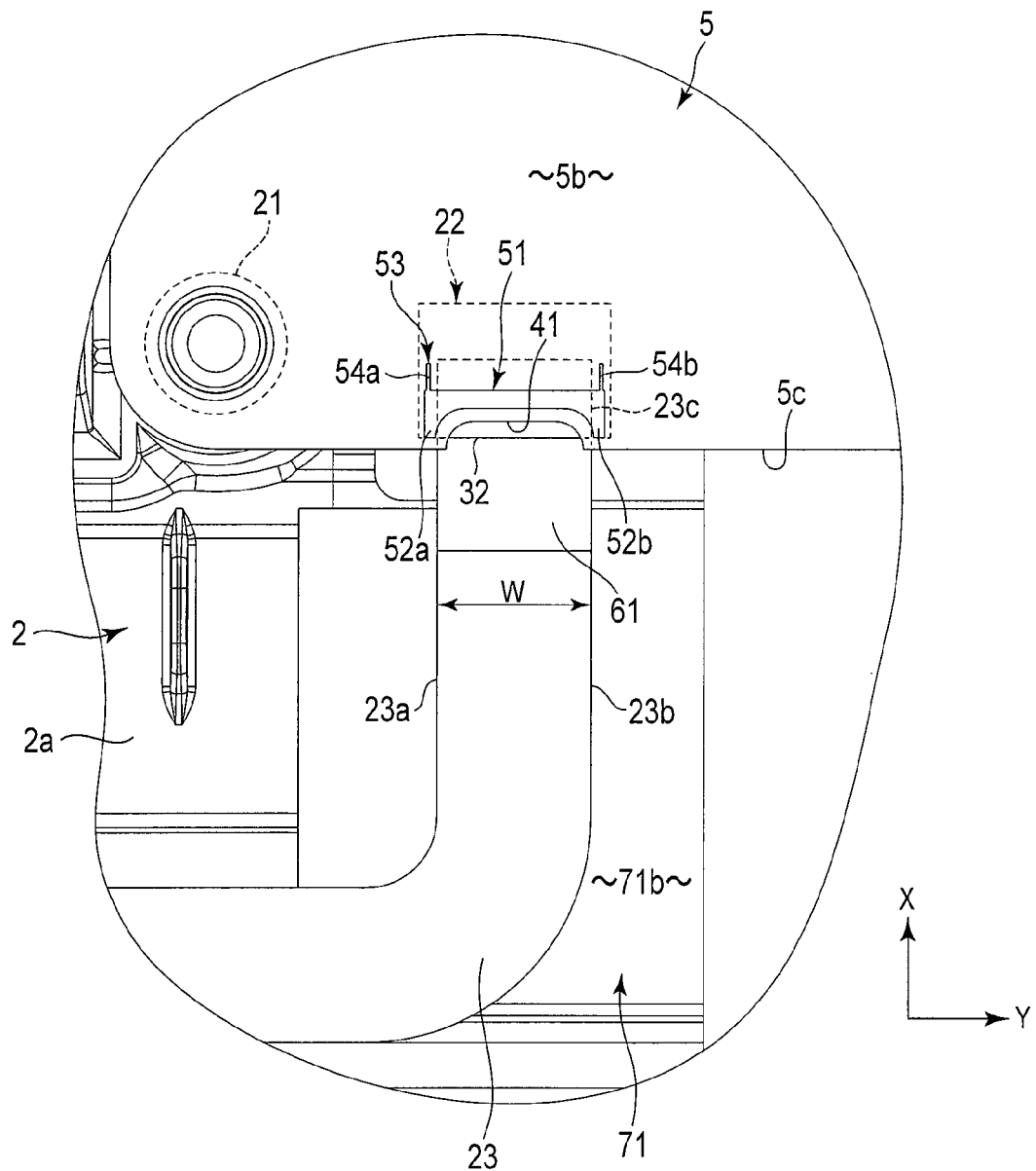
FIG. 5 is an exemplary plan view illustrating an enlarged periphery of one of the connectors shown in FIG. 4.

As shown in FIG. 5, the marking 51 of the first embodiment comprises a pair of protrusions 52a and 52b. The pair of protrusions 52a and 52b is located separately at both ends of the cutout 41, protruding toward the side surface 5c of the circuit board 5. In the first embodiment, the distance between the pair of protrusions 52a and 52b is substantially the same as the width W of the opening 31 of the connector 22.

As shown in FIG. 5, the marking 51 comprises a line portion 53. The line portion 53 extends in the insertion direction X of the flexible cable 23 to the connector 22. The flexible cable 23 comprises a pair of side edges 23a and 23b (i.e., edge portions), which extends in the insertion direction X of the flexible cable 23.

The line portion 53 of the first embodiment includes a pair of straight lines 54a and 54b, which extends substantially parallel to the pair of side edges 23a and 23b of the flexible cable 23. The pair of straight lines 54a and 54b is located separately at both ends of the marking 51. The pair of straight lines 54a and 54b is located near on the extended lines of the pair of side edges 23a and 23b of the flexible cable 23. That is, the distance between the pair of straight lines 54a and 54b is substantially the same as the width W of the opening 31 of the connector 22.

The marking 51 is formed by, for example, a silk-printed pattern or a resistless part. It should be noted that "resistless part" refers to a part where a conductor layer (e.g., copper layer) of the circuit board 5 is exposed to the outside without providing resist on a part of the surface of the circuit board 5 so that the conductor layer forms the marking 51. The marking 51 is not limited to this example and may be provided by various kinds of methods.

Next, an auxiliary plate 61 will be described in detail.

Figure 6:
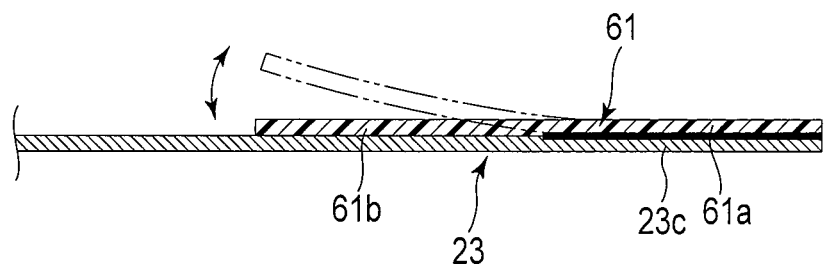
FIG. 6 is an exemplary sectional view illustrating a flexible cable and an auxiliary plate shown in FIG. 2.

As shown in FIGS. 2, 3 and 6, the auxiliary plate 61 (i.e., member, fingerhold or reinforcing plate) is attached to an end portion 23c of the flexible cable 23. The auxiliary plate 61 is located on the back side of a terminal section of the flexible cable 23. With the auxiliary plate 61 attached, the end portion 23c of the flexible cable 23 is reinforced and the terminal section is protected. The auxiliary plate 61 is inserted into the inside of the connector 22 together with, for example, the end portion 23c of the flexible cable 23.

As shown in FIG. 6, the auxiliary plate 61 has certain flexibility (i.e., bendabiilty) and can be bent. The auxiliary plate 61 comprises a first portion 61a and a second portion 61b. The first portion 61a is closer to an end of the flexible cable 23 than the second portion 61b. The first portion 61a is fixed to the end portion 23c of the flexible cable 23 by, for example, adhesive tape and double-stick tape.

On the other hand, the second portion 61b is not fixed to the flexible cable 23 and can be pulled up to (i.e. detached from) the flexible cable 23. Therefore, as shown in FIG. 7, when attaching the flexible cable 23 to the connector 22, it is possible for an assembling worker to press the flexible cable 23 toward the connector 22 by pulling up the second portion 61b of the auxiliary plate 61 and hooking his finger thereto.

Next, an insulator 71 will be described in detail.

The insulator 71 is an example of "member," "height adjustment member," "guide" or "protection member," respectively. As shown in FIGS. 2, 3, 4, 7 and 8, the insulator 71 is attached on the inner surface 2a of the housing 2 and faces the flexible cable 23. The insulator 71 is provided on the front side of the opening 31 of the connector 22, that is, on an insertion path (i.e., connection path) of the flexible cable 23. It should be noted that the insulator 71 is hatched for explanation in FIG. 2.

As shown in FIG. 7, the flexible cable 23, which is flat, is mounted on the insulator 71, for example. The flexible cable 23 is inserted into the connector 22 when moved along with the surface of the insulator 71. The insulator 71 is a sheet of rubber or synthetic resin and is softer than material of the housing 2.

The insulator 71 faces the terminal section of the flexible cable 23 in a state before the flexible cable 23 is connected to the connector 22. Therefore, the insulator 71 is located between the inner surface 2a of the housing 2 and the flexible cable 23 and functions as a protection member to protect the terminal section of the flexible cable 23.

Figure 8:
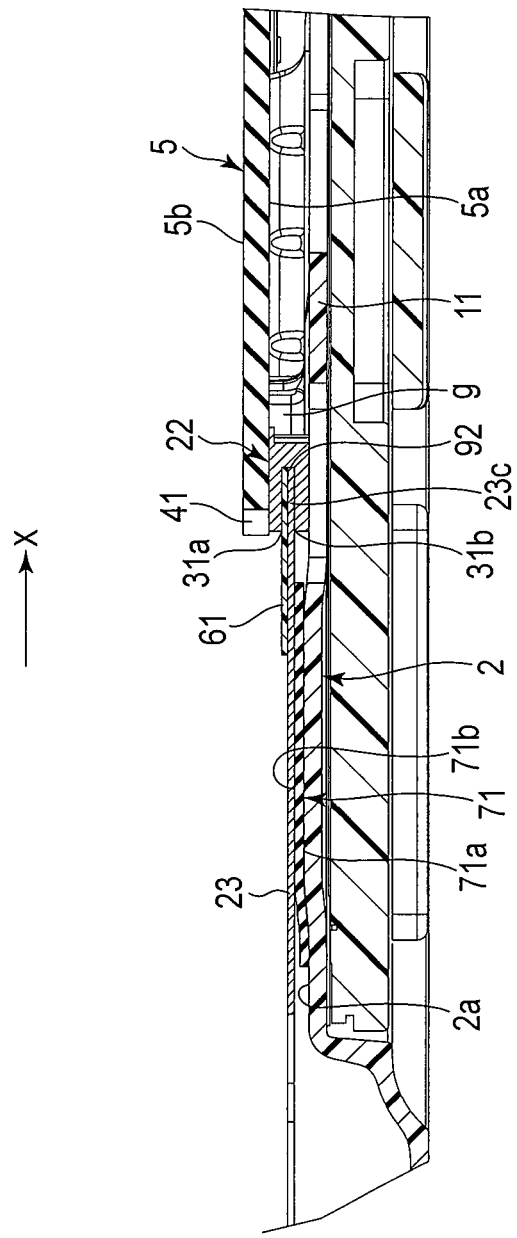
FIG. 8 is an exemplary sectional view illustrating the connector and the flexible cable shown in FIG. 2.

As shown in FIGS. 7 and 8, the insulator 71 comprises a first surface 71a and a second surface 71b. The first surface 71a is attached to the inner surface 2a of the housing 2 by, for example, double-stick tape. The second surface 71b is located opposite to the first surface 71a and exposed to the inside of the housing 2. The second surface 71b is an example of the surface of the insulator 71. The second surface 71b of the insulator 71 guides the end portion 23c of the flexible cable 23 toward the opening 31 of the connector 22.

In more detail, the opening 31 of the connector 22 comprises a first edge 31a and a second edge 31b. The first edge 31a is located closer to the first surface 5a of the circuit board 5 than the second edge 31b. The second edge 31b is located opposite to the first edge 31a. The opening 31 opens between the first edge 31a and the second edge 31b.

As shown in FIGS. 7 and 8, the thickness of the insulator 71 is set so as to make the height of the end portion 23c of the flexible cable 23 mounted on the second surface 71b substantially correspond to the height of the opening 31 of the connector 22. That is, the second surface 71b of the insulator 71 is located at the same height as the second edge 31b of the opening 31. Therefore, the end portion 23c of the flexible cable 23, which is mounted on the second surface 71b of the insulator 71, automatically faces the opening 31 of the connector 22.

The flexible cable 23 is moved toward the connector 22 while being slipped on the second surface 71b of the insulator 71. The flexible cable 23 is moved toward the connector 22 while being slightly pressed on the second surface 71b of the insulator 71 by, for example, a finger hooked to the auxiliary plate 61.

As shown in FIG. 8, the second portion 61b of the auxiliary plate 61 is overlapped with the insulator 71 in a state where the flexible cable 23 is connected to the connector 22. According to such a structure, the flexible cable 23 is stably supported by the second surface 71b of the insulator 71 in a state where the flexible cable 23 is completely inserted to the connector 22.

Also, as shown in FIG. 2, an another connector 81 (i.e., second connector) is attached on the first surface 5a of the circuit board 5. An another flexible cable 82 is configured to be connected to the connector 81.

Subsequently, it will be described how the flexible cable 23 is connected to the connector 22.

As shown in FIG. 2, the circuit board 5, on which the connector 22 and the connector 81 are mounted, is attached to the inner surface of the upper cover 17 before, for example, the upper cover 17 and the lower cover 18 are combined. The circuit board 5 is attached to the upper cover 17 after the flexible cable 82 is connected to the connector 81. That is, the flexible cable 82 is connected to the connector 81 before the circuit board 5 is attached to the upper cover 17. Therefore, it is easy to connect the flexible cable 82 to the connector 81.

On the other hand, the circuit board 5 is attached to the inner surface of the upper cover 17, before the flexible cables 23 are connected to the connectors 22. Since the connectors 22 are located between the circuit board 5 and the inner surface 2a of the housing 2 and are covered up by the circuit board 5, the locations of the connectors 22 (e.g., the location of the openings 31) are hard to identify.

The electronic apparatus 1, which has been getting thinner recently, has a narrow gap between the circuit board 5 and the inner surface 2a of the housing 2. It is therefore not easy to connect the flexible cables 23 to the connectors 22. Also, when the connectors 22 are located between the circuit board 5 and the inner surface 2a of the housing 2, it is difficult to recognize insertion abnormalities (e.g. oblique insertion) of the flexible cables 23 to the connectors 22.

In the first embodiment, the circuit board 5 comprises the cutouts 41 and the markings 51. An assembling worker can easily identify the locations of the connectors 22 (e.g., the locations of the openings 31) by the cutouts 41 and the markings 51.

The assembling worker places the flexible cable 23 on the second surface 71b of the insulator 71 in a front location of the connector 22 off the circuit board 5. This makes the end portion 23c of the flexible cable 23 face the opening 31 of the connector 22, and the height of the end portion 23c of the flexible cable 23 corresponds substantially to that of the opening 31 of the connector 22.

The flexible cable 23, which is mounted on the insulator 71, is stably positioned since the cable is flat. Therefore, it is easy for the flexible cable 23 to be guided along with the surface of the insulator 71.

The assembling worker pulls up the second portion 61b of the auxiliary plate 61, hooks his finger to the second portion 61b, and presses the flexible cable 23 toward the opening 31 of the connector 22 while making at least either of the cutout 41 or the marking 51 a mark. After the end portion 23c of the flexible cable 23 is inserted into the opening 31 of the connector 22, the assembling worker pushes the end portion 23c of the flexible cable 23 into a deepest part 92 of the internal space of the connector 22 by further pushing the second portion 61b of the auxiliary plate 61. The flexible cable 23 is then connected to the connector 22.

The assembling worker confirms the relationship between the pair of side edges 23a and 23b of the flexible cable 23 and the pair of straight lines 54a and 54b of the marking 51, before, while and/or after connecting the flexible cable 23 to the connector 22.

If the pair of side edges 23a and 23b of the flexible cable 23 and the pair of straight lines 54a and 54b of the marking 51 are substantially parallel, it turns out that the flexible cable 23 is plugged straight and that no insertion abnormality occurs. On the other hand, if the pair of side edges 23a and 23b of the flexible cable 23 and the pair of straight lines 54a and 54b of the marking 51 are not substantially parallel, insertion abnormality such as oblique insertion of the flexible cable 23 to the connector 22 is likely to occur and therefore the assembling worker needs to retry connecting, for example.

According to the above-mentioned structure, it is possible to improve assembly performance of the electronic apparatus 1. That is, the electronic apparatus 1 of the first embodiment comprises the housing 2, the circuit board 5 in the housing 2, and the connector 22. The connector 22 comprises the opening 31 into which the flexible cable 23 is configured to be plugged. The connector 22 is attached to the circuit board 5 and faces the inner surface 2a of the housing 2. The circuit board 5 is provided with the cutout 41 in a position corresponding to the center portion of the opening 31 of the connector 22.

According to such a structure, the location of the opening 31 of the connector 22 located between the circuit board 5 and the inner surface 2a of the housing 2 can be easily identified by the cutout 41 of the circuit board 5. This enables the flexible cable 23 to be easily attached to the connector 22, which is provided in a hard-to-identify location. It is therefore possible to improve assembly performance of the electronic apparatus 1.

According to the first embodiment, a part of the connector 22 is exposed on the side of the second surface 5b of the circuit board 5 through the cutout 41. According to such a structure, the location of the connector 22 can be identified more easily and assembly performance of the electronic apparatus 1 can be further improved.

Also, the opening 31 of the connector 22 is easier to identify through the cutout 41 when the cutout 41 is provided than when not provided. When the opening 31 of the connector 22 is visible through the cutout 41, it is possible to visually confirm presence or absence of insertion abnormality of the flexible cable 23, through which the flexible cable 23 can be attached more efficiently.

Further, when a Non-ZIF connector that does not have a locking mechanism is mounted, it is not necessary to provide a cutout to expose a locking mechanism. Therefore, it is possible to reduce the size of the cutout 41 and to curb the influences (e.g., restriction on wiring layout) of the circuit board 5 caused by providing the cutout 41.

In the first embodiment, the circuit board 5 comprises the first surface 5a, on which the connector 22 is attached in face of the inner surface 2a of the housing 2, and the second surface 5b, which is located opposite to the first surface 5a. The second surface 5b is provided with the marking 51 in a position corresponding to the connector 22.

According to such a structure, the position of the connector 22, whose location is hard to identify, can be easily identified by the marking 51 of the circuit board 5. It is therefore possible to attach the flexible cable 23 to the connector 22 more easily.

In the first embodiment, the marking 51 comprises a portion having substantially the same width as that of the opening 31 of the connector 22. According to such a structure, since the location of the opening 31 of the connector 22 (particularly, the location and width of a width direction Y of the opening 31) can be identified more precisely, the flexible cable 23 can be attached to the connector 22 more easily.

In the first embodiment, the marking 51 comprises the line portion 53, which extends in the insertion direction X of the flexible cable 23. According to such a structure, it is possible to easily confirm presence or absence of insertion abnormalities (e.g., oblique insertion) of the flexible cable 23 by observing the relationship between the line portion 53 and the flexible cable 23. Therefore, the flexible cable 23 can be attached to the connector 22 more efficiently.

In the first embodiment, the flexible cable 23 comprises the pair of side edges 23a and 23b, which extends in the insertion direction X of the flexible cable 23. The line portion 53 comprises the pair of straight lines 54a and 54b, which extends substantially parallel to the pair of side edges 23a and 23b of the flexible cable 23. According to such a structure, it is possible to more easily and precisely confirm whether the flexible cable 23 is connected straight to the connector 22, by observing the relationship between the pair of side edges 23a and 23b and the pair of straight lines 54a and 54b.

In the first embodiment, the pair of straight lines 54a and 54b is provided near on the extended lines of the pair of side edges 23a and 23b of the flexible cable 23. According to such a structure, it is possible to more easily confirm the relationship between the pair of side edges 23a and 23b of the flexible cable 23 and the pair of straight lines 54a and 54b. Therefore, the flexible cable 23 can be attached to the connector 22 more efficiently.

In the first embodiment, a distance between the pair of straight lines 54a and 54b is substantially the same as the width W of the opening 31. According to such a structure, the location of the opening 31 of the connector 22 can be identified more easily by the pair of straight lines 54a and 54b.

In the first embodiment, the electronic apparatus 1 comprises a member (e.g., the insulator 71) attached on the inner surface 2a of the housing 2. The height of the flexible cable 23 mounted on the insulator 71 is substantially the same height of the opening 31 of the connector 22. According to such a structure, since the end portion 23c of the flexible cable 23 faces the opening 31 of the connector 22, it is not necessary to align the location of the flexible cable 23 in a vertical direction.

According to such a structure, by moving the flexible cable 23 along with the surface of the insulator 71, the flexible cable 23 can be easily inserted into the opening 31 of the connector 22. Therefore, the flexible cable 23 can be attached to the connector 22 more efficiently.

In the first embodiment, the insulator 71 faces the terminal section of the flexible cable 23 in a state before the flexible cable 23 is connected to the connector 22, and is softer than the housing 2. According to such a structure, in the process of moving the flexible cable 23 toward the connector 22, the terminal section of the flexible cable 23 does not get hurt by being scraped by the inner surface 2a of the housing 2. That is, it is possible to protect the terminal section of the flexible cable 23 and improve reliability of the electronic apparatus 1.

In the first embodiment, the electronic apparatus 1 further comprises the auxiliary plate 61 having the first portion 61a, which is fixed to the end portion 23c of the flexible cable 23, and the second portion 61b, which can be pulled up with respect to the flexible cable 23 and hand-hooked when the flexible cable 23 is pressed to the connector 22. According to such a structure, the flexible cable 23 can be easily pressed to the connector 22 so that the flexible cable 23 can be attached more efficiently.

Next, the electronic apparatus 1 of a second, third and fourth embodiment will be described. It should be noted that a function having the same or similar to the structure of the first embodiment will be given the same reference number to omit the explanation. Also, the structures other than explained below are the same as the first embodiment.

Second Embodiment

Figure 9:
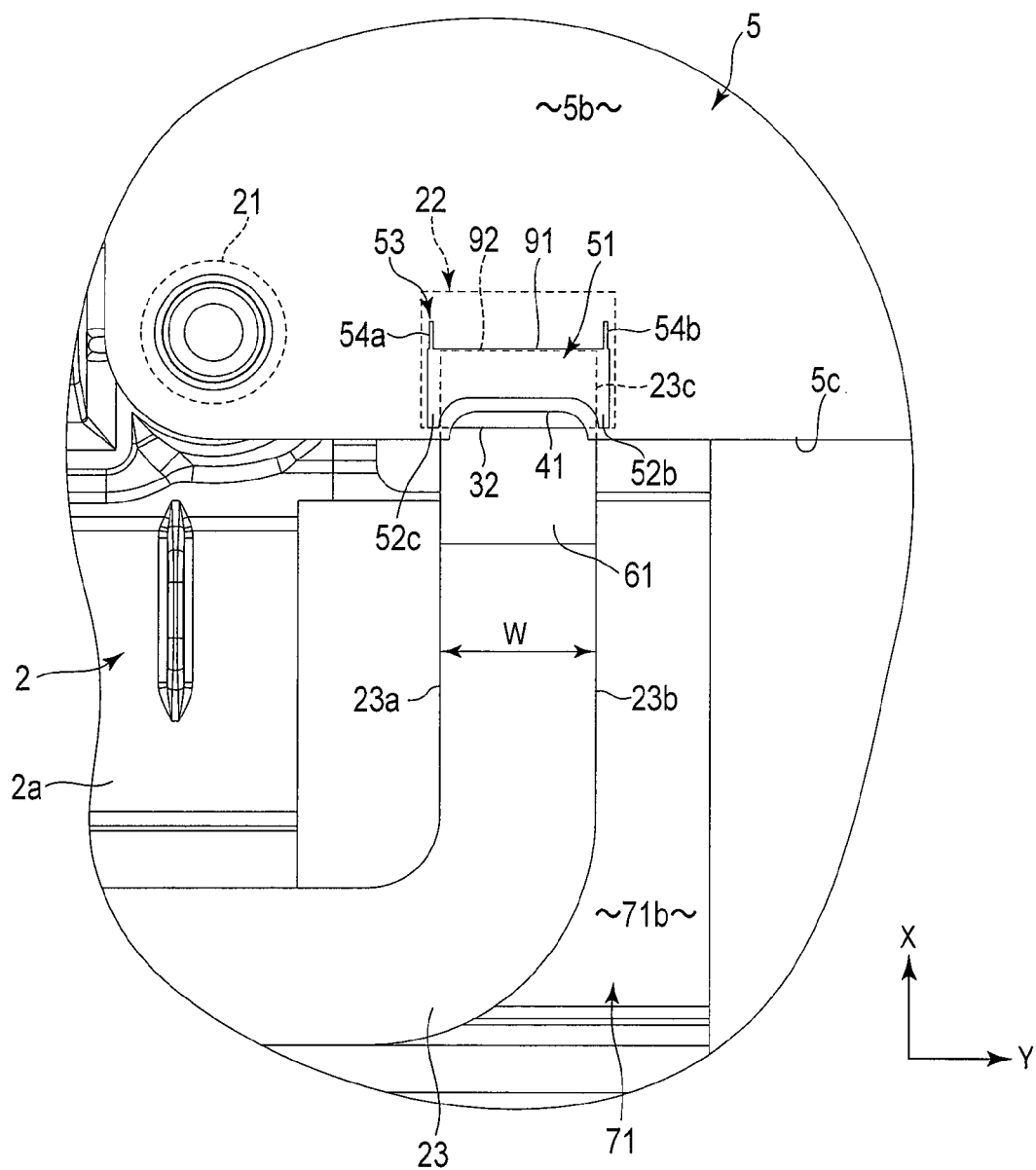
FIG. 9 is an exemplary plan view illustrating a circuit board of an electronic apparatus according to a second embodiment.

FIG. 9 shows the circuit board 5 of the electronic apparatus 1 of the second embodiment. As shown in FIG. 9, the form of the marking 51 of the second embodiment is different from that of the first embodiment. The marking 51 of the second embodiment comprises an edge 91, which extends in the width direction Y of the opening 31 of the connector 22. The "width direction Y of the opening 31 of the connector 22" represents a direction substantially orthogonal to the insertion direction X of the flexible cable 23 to the connector 22. In the second embodiment, the location of the edge 91 of the marking 51 corresponds to the location of the deepest part 92 of the internal space of the connector 22, into which the flexible cable 23 is plugged (i.e., a location where the top end of the flexible cable 23 abuts; see FIGS. 3, 7 and 8).

According to such a structure, as with the first embodiment, it is possible to improve assembly performance of the electronic apparatus 1. Further, according to the second embodiment, by the location of the edge 91 of the marking 51, it is possible to easily identify the location of the deepest part 92 of the internal space of the connector 22, into which the flexible cable 23 is plugged. It is thus easy for the assembling worker to imagine how far the flexible cable 23 should be inserted (i.e., to what extent the cable should be inserted). Therefore, the flexible cable 23 can be attached more efficiently and assembly performance of the electronic apparatus 1 can be improved.

Third Embodiment

Figure 10:
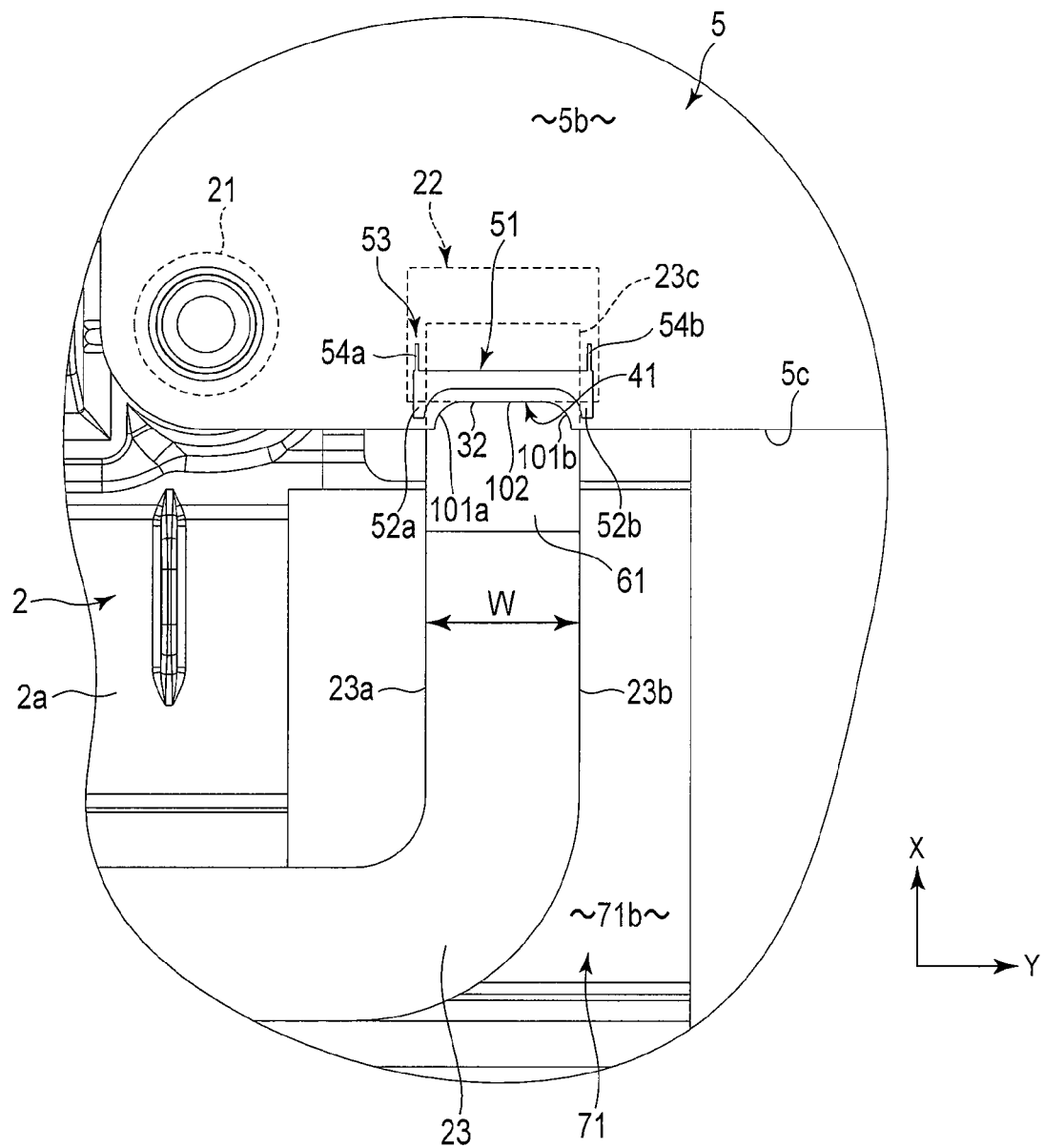
FIG. 10 is an exemplary plan view illustrating a circuit board of an electronic apparatus according to a third embodiment.

FIG. 10 shows the circuit board 5 of the electronic apparatus 1 of the third embodiment. As shown in FIG. 10, the location of the connector 22 in the third embodiment is different from that of the first embodiment. In the third embodiment, the cutout 41 of the circuit board 5 comprises a pair of arc portions 101a and 101b and a bottom portion 102, which is located therebetween. The bottom portion 102 is a portion most recessed from the side surface 5c of the circuit board 5 in the cutout 41.

In the third embodiment, the location of the front surface 32 of the connector 22 (i.e., a surface where the opening 31 opens) corresponds to the location of the bottom portion 102 of the cutout 41. That is, the front surface 32 of the connector 22 and the bottom portion 102 of the cutout 41 are located on the same plane. In other words, the front surface 32 of the connector 22 and the bottom portion 102 of the cutout 41 are lined in a thickness direction of the circuit board 5.

According to such a structure, as with the first embodiment, it is possible to improve assembly performance of the electronic apparatus 1. Further, according to the third embodiment, the location of the opening 31 of the connector 22 can be easily identified by the location of the bottom portion 102 of the cutout 41. Therefore, the flexible cable 23 can be attached more efficiently and assembly performance of the electronic apparatus 1 can be improved.

Fourth Embodiment

Figure 11:
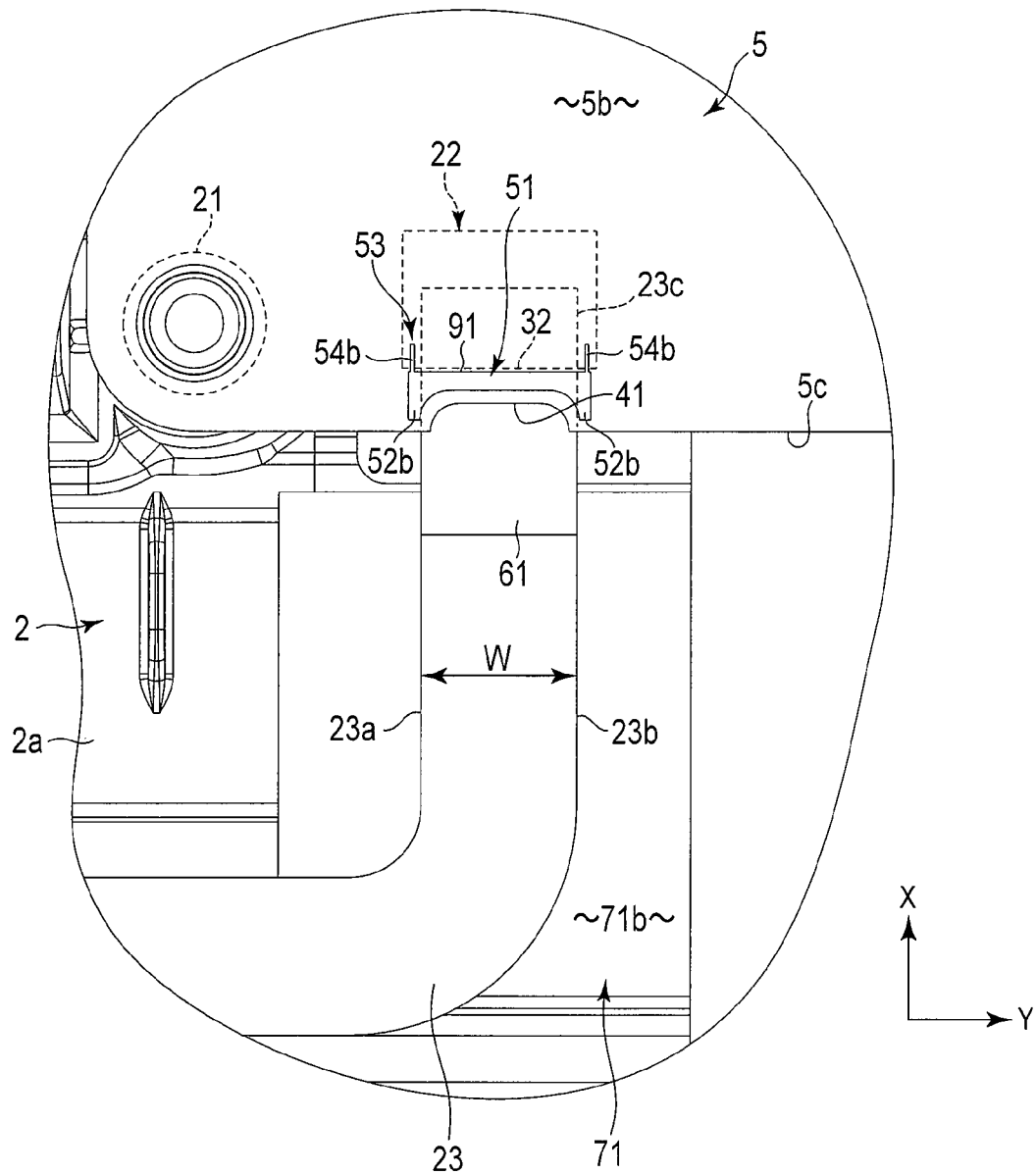
FIG. 11 is an exemplary plan view illustrating a circuit board of an electronic apparatus according to a fourth embodiment.

FIG. 11 shows the circuit board 5 of the electronic apparatus 1 of the fourth embodiment. As shown in FIG. 11, the location of the connector 22 of the fourth embodiment is different from that of the first embodiment. The marking 51 of the fourth embodiment comprises the edge 91, which extends in the width direction Y of the opening 31 of the connector 22. In the fourth embodiment, the location of the edge 91 of the marking 51 corresponds to the location of the front surface 32 of the connector 22 in the insertion direction X of the flexible cable 23.

According to such a structure, as with the first embodiment, it is possible to improve assembly performance of the electronic apparatus 1. Further, according to the fourth embodiment, it is possible to easily identify the location of the front surface 32 of the connector 22 by the location of the edge 91 of the marking 51. It is thus easy for the assembling worker to imagine how far the flexible cable 23 should be inserted (i.e., to what extent the cable should be inserted). Therefore, the flexible cable 23 can be attached more efficiently and assembly performance of the electronic apparatus 1 can be improved.

Note that the present invention is not limited to the above-described embodiments without any change but may be modified in various ways without departing from the scope at the execution stage. Also, various types of inventions can be made by appropriately combining the plurality of constituting elements disclosed in the above-mentioned embodiments. For example, some constituting elements may be deleted from all of the constituting elements disclosed in the embodiments. Further, the constituting elements of different embodiments may be combined appropriately.

For example, the marking 51 may be constituted of only the line portion 53. The line portion 53 is not limited to a portion having the pair of straight lines 54a and 54b. The number of straight line of the line portion 53 may be one, three or more. The marking 51 is not limited to particular forms and may be, for example, only a point. The location of the connector 22 is not limited to the above-mentioned examples. The locations of the connector 22 and the marking 51 may be determined arbitrarily. The auxiliary plate 61 and the insulator 71 may be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus, comprising:
a housing;
a circuit board in the housing; and
a connector that comprises an opening into which a flexible cable is configured to be plugged, the connector being attached to the circuit board and facing an inner surface of the housing,
wherein the circuit board comprises (i) a first surface on which the connector is attached, (ii) a second surface that is opposite to the first surface and includes a marking in a position corresponding to the connector, and (iii) a cutout in a position corresponding to a center portion of the opening of the connector, the marking comprises a portion having a width substantially equal to a width of the opening of the connector.

2. An electronic apparatus, comprising:
a housing;
a circuit board in the housing; and
a connector that comprises an surface including an opening into which a flexible cable is configured to be plugged, the connector being attached to the circuit board and facing an inner surface of the housing,
wherein the circuit board comprises (i) a first surface on which the connector is attached, (ii) a second surface that is opposite to the first surface and includes a marking in a position corresponding to the connector, and (iii) a cutout in a position corresponding to a center portion of the opening of the connector, the marking comprises an edge extending in a width direction of the opening and a location of the edge of the marking corresponds to a location of the surface of the connector in an insertion direction of the flexible cable.

3. An electronic apparatus, comprising:
a housing;
a circuit board in the housing; and
a connector that comprises an opening into which a flexible cable is configured to be plugged, the connector being attached to the circuit board and facing an inner surface of the housing,
wherein the circuit board comprises (i) a first surface on which the connector is attached, (ii) a second surface that is opposite to the first surface and includes a marking in a position corresponding to the connector, and (iii) a cutout in a position corresponding to a center portion of the opening of the connector, the marking comprises an edge extending in a width direction of the opening and a location of the edge of the marking corresponds to a position of a deepest part of an internal space of the connector, into which the flexible cable is configured to be plugged, in an insertion direction of the flexible cable.

4. An electronic apparatus, comprising:
a housing;
a circuit board in the housing; and
a connector that comprises an opening into which a flexible cable is configured to be plugged, the connector being attached to the circuit board and facing an inner surface of the housing,
wherein the circuit board comprises (i) a first surface on which the connector is attached, (ii) a second surface that is opposite to the first surface and includes a marking in a position corresponding to the connector, and (iii) a cutout in a position corresponding to a center portion of the opening of the connector,
wherein the marking comprises a line portion extending in an insertion direction of the flexible cable that comprises a pair of side edges extending in the insertion direction, and the line portion comprises a pair of straight lines extending substantially parallel to the pair of side edges of the flexible cable.

5. The electronic apparatus of claim 4, wherein the pair of straight lines are near on respective extended lines of the pair of side edges of the flexible cable.

6. The electronic apparatus of claim 4, wherein a distance between the pair of straight lines is substantially equal to a width of the opening.

7. An electronic apparatus of claim 1, comprising:
a housing;
a circuit board in the housing; and
a connector that comprises an opening into which a flexible cable is configured to be plugged, the connector being attached to the circuit board and facing an inner surface of the housing,
wherein the circuit board comprises a cutout in a position corresponding to a center portion of the opening of the connector, the cutout comprises a bottom portion most recessed from a side surface of the circuit board in the cutout and
wherein a location of the surface of the connector corresponds to a location of the bottom portion of the cutout.

8. An electronic apparatus comprising:
a housing;
a circuit board in the housing;
a connector comprises an opening into which a flexible cable is configured to be plugged, the connector being attached to the circuit board and facing an inner surface of the housing; and
a member attached to the inner surface of the housing, the member comprises a surface configured to make a height of the flexible cable mounted on the member correspond substantially to a height of the opening of the connector.

9. The electronic apparatus of claim 8, wherein the member is configured to face a terminal section of the flexible cable in a state before the flexible cable is connected to the connector, and is softer than the housing.

10. An electronic apparatus comprising:
a housing;
a circuit board in the housing;

a connector comprising an opening into which a flexible cable is configured to be plugged, the connector being attached to the circuit board and facing an inner surface of the housing; and an auxiliary plate comprising a first portion and a second portion, the first portion of the auxiliary plate is fixed to an end of the flexible cable and the second portion of the auxiliary plate is configured to be pulled up with respect to the flexible cable and hand-hooked when the flexible cable is pressed to the connector.

* * * * *